(12) United States Patent
Gershfeld

(10) Patent No.: US 10,514,834 B2
(45) Date of Patent: Dec. 24, 2019

(54) METHOD AND SYSTEM FOR SELECTING OBJECTS ON A COMPUTER SCREEN

(71) Applicant: Jack Gershfeld, Fullerton, CA (US)

(72) Inventor: Jack Gershfeld, Fullerton, CA (US)

( * ) Notice: Subject to any disclaimer, the term of this patent is extended or adjusted under 35 U.S.C. 154(b) by 78 days.

(21) Appl. No.: 15/814,536

(22) Filed: Nov. 16, 2017

(65) Prior Publication Data

US 2019/0146659 A1 May 16, 2019

(51) Int. Cl.
*G06F 3/0484* (2013.01)
*G06F 3/0489* (2013.01)
*G06F 3/0481* (2013.01)
*G06F 3/0482* (2013.01)
*G06F 17/50* (2006.01)

(52) U.S. Cl.
CPC ........ *G06F 3/04842* (2013.01); *G06F 3/0482* (2013.01); *G06F 3/0489* (2013.01); *G06F 3/04815* (2013.01); *G06F 3/04897* (2013.01); *G06F 17/50* (2013.01)

(58) Field of Classification Search
CPC ............. G06F 3/04842; G06F 3/04815; G06F 3/04897; G06F 17/50
See application file for complete search history.

(56) References Cited

U.S. PATENT DOCUMENTS

| 2008/0018665 | A1* | 1/2008 | Behr | G09G 3/3233 345/629 |
| 2017/0285914 | A1* | 10/2017 | Ellbogen | G06F 16/957 |
| 2018/0373422 | A1* | 12/2018 | Cao | G06F 17/2247 |

OTHER PUBLICATIONS

Steve Johnson, "Selecting Similar Objects," Sep. 5, 2012, InformIT, available at https://web.archive.org/web/20121003134346/http://www.informit.com/articles/article.aspx?p=1915160&seqNum=18. (Year: 2012).*

* cited by examiner

*Primary Examiner* — Andrew T Chiusano
(74) *Attorney, Agent, or Firm* — Vladi Khiterer

(57) ABSTRACT

A method and system for selecting objects displayed on a computer screen by engaging a keyboard selection shortcut. Engaging the keyboard selection shortcut after selecting an object causes the objects of the same type to be selected. Engaging the keyboard selection shortcut again allows specifying secondary attributes and selection of objects having both, the same type and selected secondary attributes.

6 Claims, 11 Drawing Sheets

PRIOR ART

PRIOR ART

PRIOR ART

PRIOR ART

PRIOR ART

ABCDEFTHIJKLMNOP

ABCDEFTHIJKLMNOP

ABCDEFTHIJKLMNOP

ABCDEFTHIJKLMNOP

ABCDEFTHIJKLMNOP

*ABCDEFTHIJKLMNOP*

*ABCDEFTHIJKLMNOP*

~~ABCDEFTHIJKLMNOP~~

ABCDEFTHIJKLMNOP

METHOD AND SYSTEM FOR SELECTING OBJECTS ON A COMPUTER SCREEN

FIELD OF THE INVENTION

The present invention relates to a computer graphic software application, including CAD (Computer Aided Design) method and system for selecting objects displayed on a computer screen, and in particular the use of a keyboard selection shortcut for such selection.

DESCRIPTION OF THE PRIOR ART

A keyboard selection shortcut is conventionally used and provides a convenient way to select all items displayed on the computer screen, be it in a file folder, a word processing program or in graphic software application. Many operating systems come with a predetermined keyboard selection shortcut for such selection. For example, in software applications running on Microsoft Windows, pressing and holding down the "ALT" followed by pressing "A" keys causes selection of all objects displayed on the computer screen, as shown in FIG. 1. In software applications running on Mac OS, pressing and holding down the "command" followed by pressing "A" keys does the same.

Graphic or CAD software applications are often used for preparation and editing of schematics (i.e. electronic circuits and the like) where selection of similar objects (for example, wires or specific electronic components) is required. Using a conventional keyboard selection shortcut does not assist as it causes selection of all objects displayed on the computer screen and not just the objects that need to be selected. This leaves selecting of the needed objects one by one, which is time consuming and inconvenient.

What is needed is a method and system for selecting objects displayed on the computer screen by way of a keyboard selection shortcut that allows selection of the desired objects rather than selecting all objects displayed on the computer screen. The present invention satisfies this need.

SUMMARY OF THE INVENTION

Graphic or CAD software applications conventionally categorize objects displayed on the computer screen by a type and one or more secondary attributes. In the method of this invention, a user selects a first object by clicking on the object with a mouse or pointing device. The user then engages the keyboard selection shortcut (i.e. by pressing and holding down the "ALT" followed by pressing "A" keys), which causes selection of all displayed objects of the same type as the first object. Engaging the keyboard selection shortcut again causes displaying of a selection criteria window with a list of secondary attributes. Selection of one or more secondary attributes causes selection of objects comprising both, the same type as the first selected object and the selected secondary attributes.

The system of this invention provides a computer system comprising memory encoded with a computer graphic software application performing the operations described above.

BRIEF DESCRIPTION OF THE DRAWINGS

FIG. 11 shows examples of text with different font types, sizes and decorations.

DETAILED DESCRIPTION OF THE PREFERRED EMBODIMENT

Figure 1:
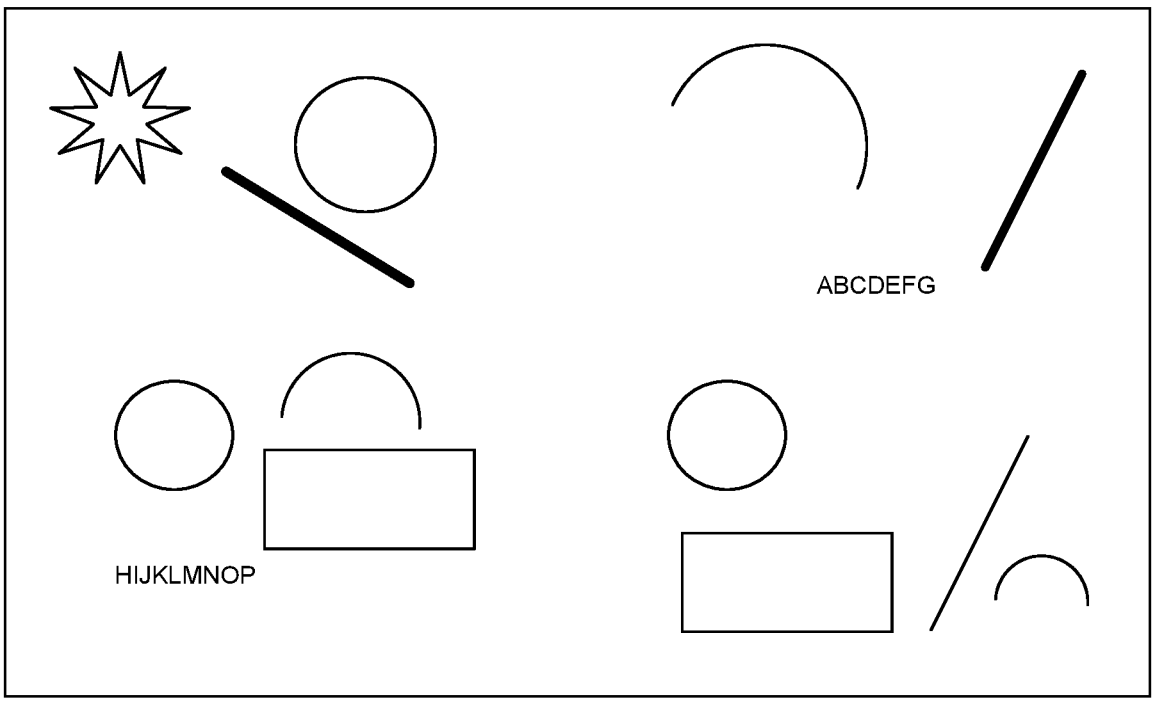
FIG. 1 is an exemplary computer display screen that illustrates the conventional method of selecting objects by engaging a keyboard selection shortcut.
Figure 1:
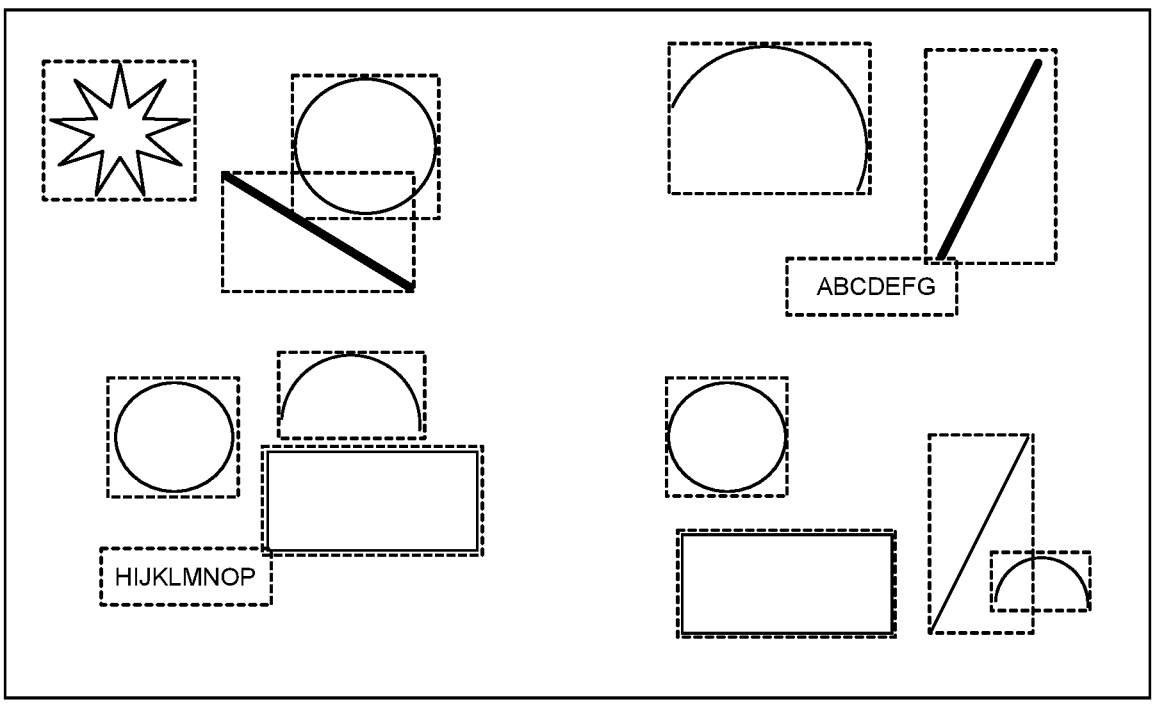

Viewing FIG. 1, the computer screen in the top portion of FIG. 1 shows a number of objects displayed. The bottom portion of FIG. 1 shows engaging the keyboard selection shortcut, shown as pressing and holding down the "ALT" followed by pressing "A" keys. All objects displayed on the computer screen are selected (selection of objects in all figures is shown by a dashed outline around the selected object). This is the conventional method of selecting objects displayed on the computer screen by engaging a keyboard selection shortcut.

Figure 2:
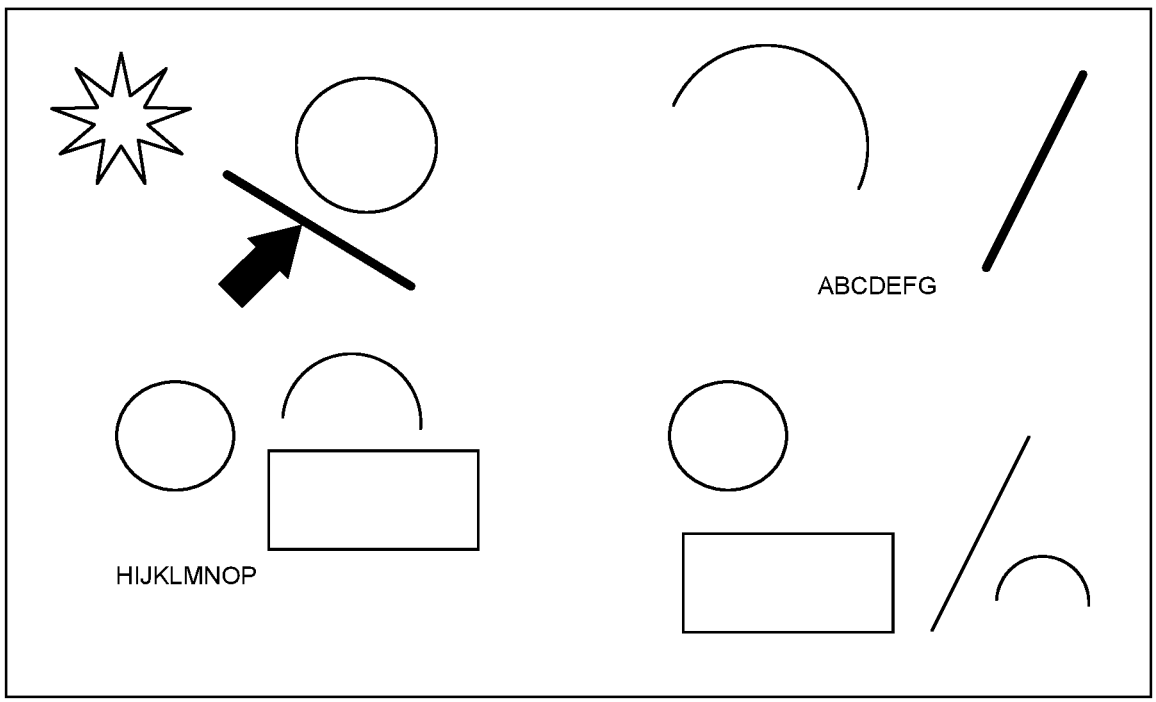
FIG. 2 is an exemplary computer display screen that illustrates steps in the method of selecting objects according to this invention disclosed in claim 1.
Figure 2:
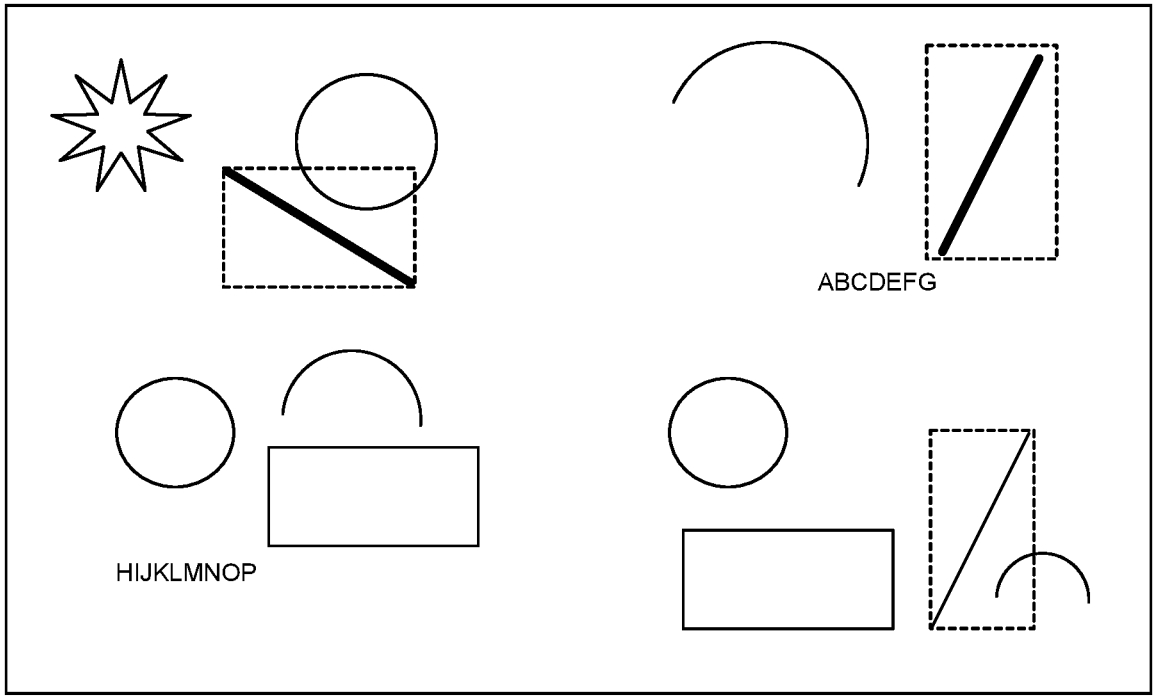
Figure 3:
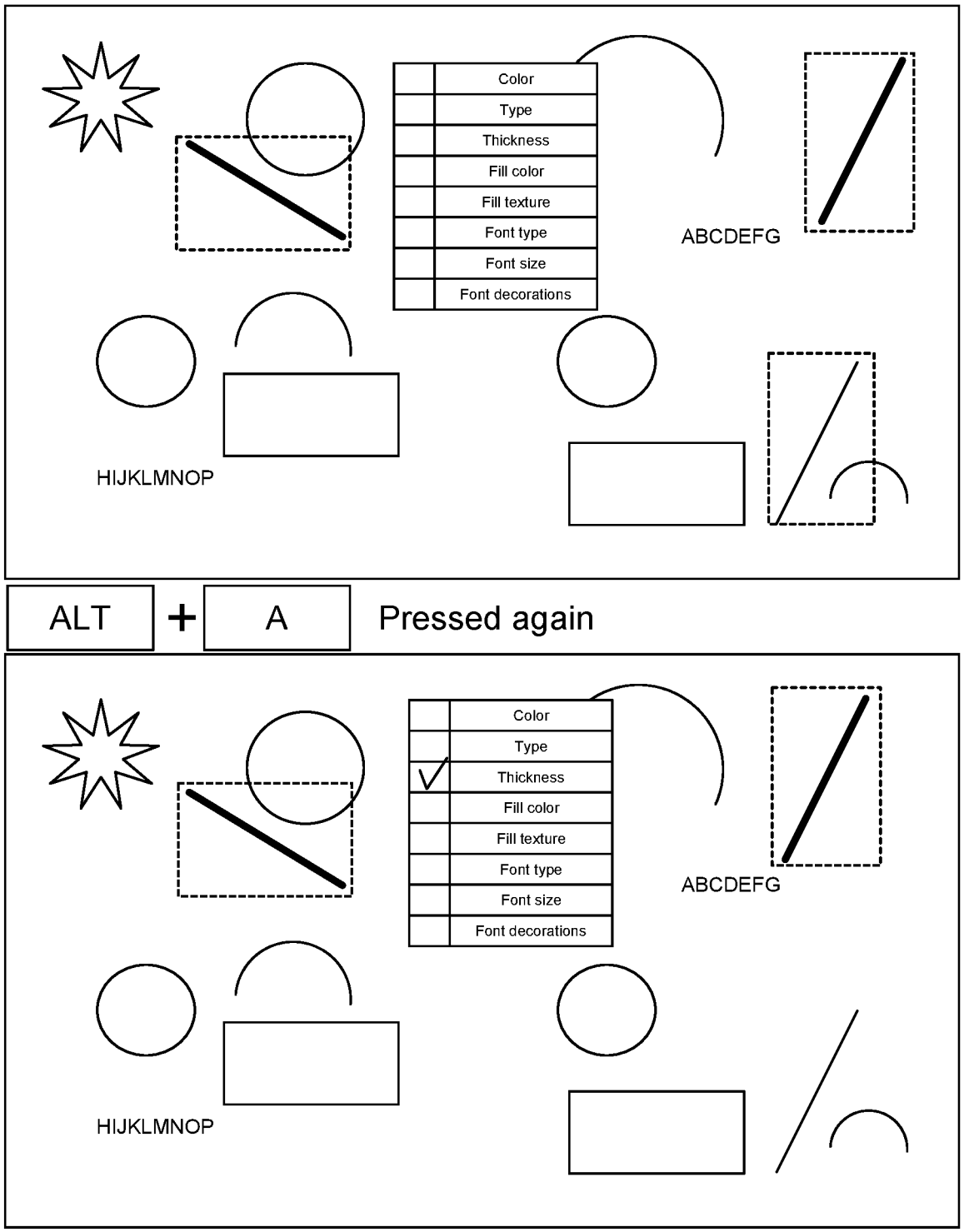
FIG. 3 is an exemplary computer display screen that illustrates steps in the method of selecting objects according to this invention disclosed in claim 2.
Figure 4:
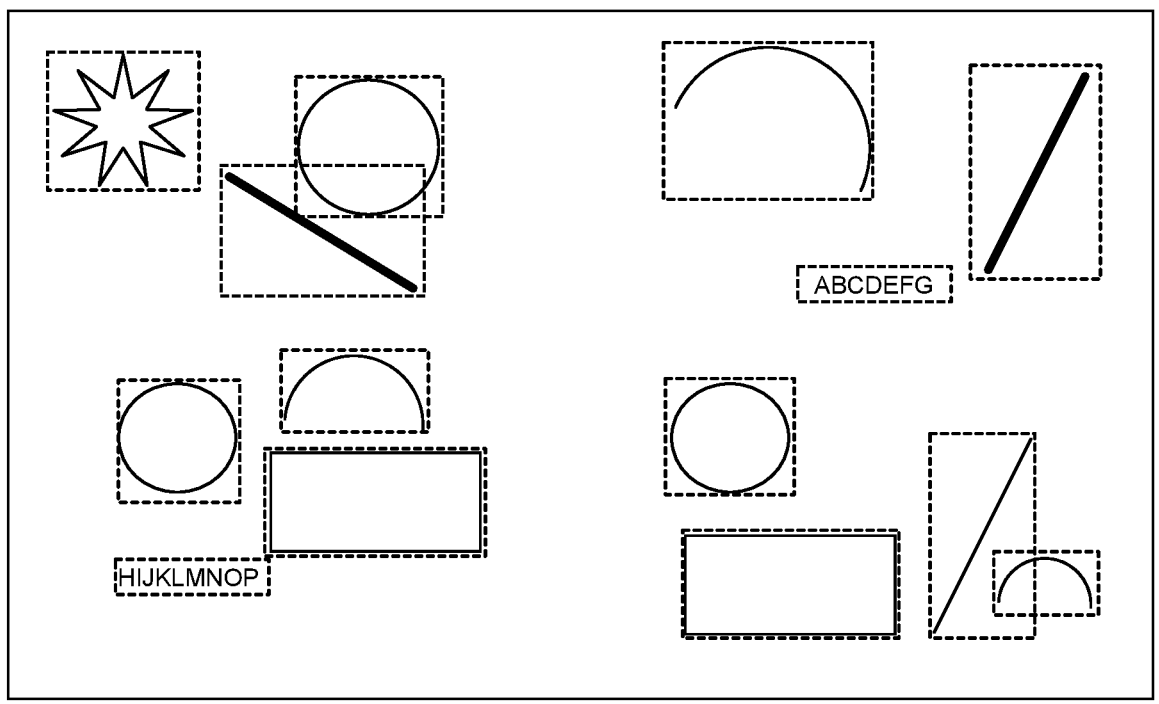
FIG. 4 is an exemplary computer display screen that illustrates steps in the method of selecting objects according to this invention disclosed in claim 3.

Viewing now, simultaneously, FIG. 2 through FIG. 4, a computer graphic software application implementing the method according to this invention comprises a keyboard selection shortcut. Further, in the computer graphic software application implementing the method according to this invention, each object displayed on the computer screen comprises a type, namely, a line, a rectangle, a triangle, an arc, a circle, a text, an image, a table, a complex shape. A complex shape is a shape other than a triangle, a circle or a rectangle.

In addition to the type, in the computer graphic software application implementing the method according to this invention, each object displayed on the computer screen comprises one or more secondary attributes, namely, outline line thickness, outline line color, outline line type, fill color, fill texture, text font type, text font size, text font decorations.

In the exemplary embodiment shown in FIG. 1 through FIG. 4, a complex shape is shown in the upper left portion of the computer screen. Three circles, three arcs, two rectangles, two texts and three lines are shown on the computer screen. The two lines shown in the upper portion of the computer screen are shown with higher outline line thickness than the line shown in the lower right portion of the computer screen.

Figure 5:
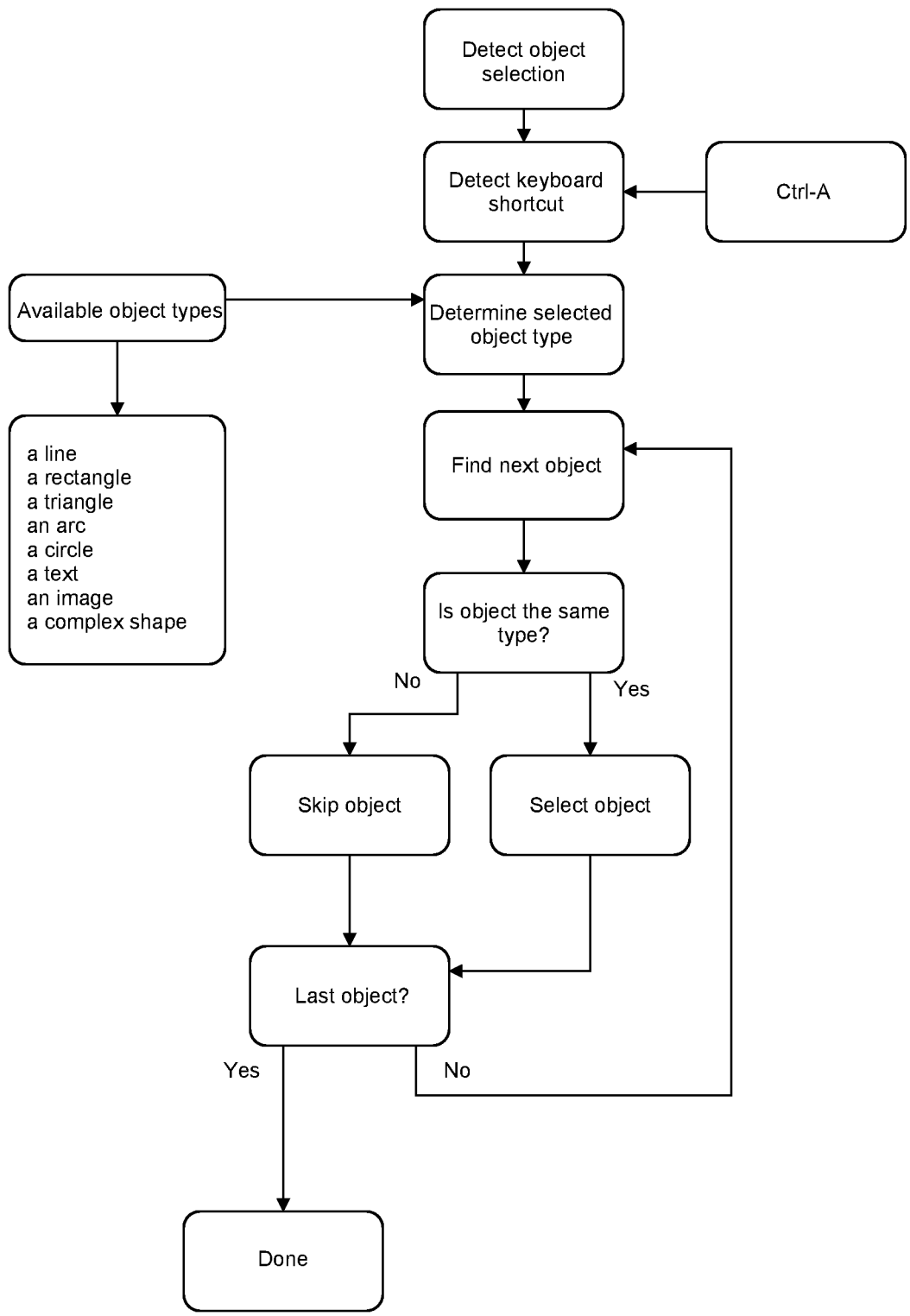
FIG. 5 is a logic flow diagram illustrating the process for implementation of the steps in the method of selecting objects according to this invention disclosed in claim 1.

Viewing now, simultaneously, FIG. 2 and FIG. 5, a user selects a first object, the first object is shown as the line in the upper left portion of the computer screen. The user then engages the keyboard selection shortcut, by pressing and holding down the "ALT" followed by pressing "A" keys. This causes selection of all other objects comprising the same type as the first object. Since the first object's type is a line, all lines are selected, as shown in the bottom portion of FIG. 2. No objects other than lines are selected.

Figure 6:
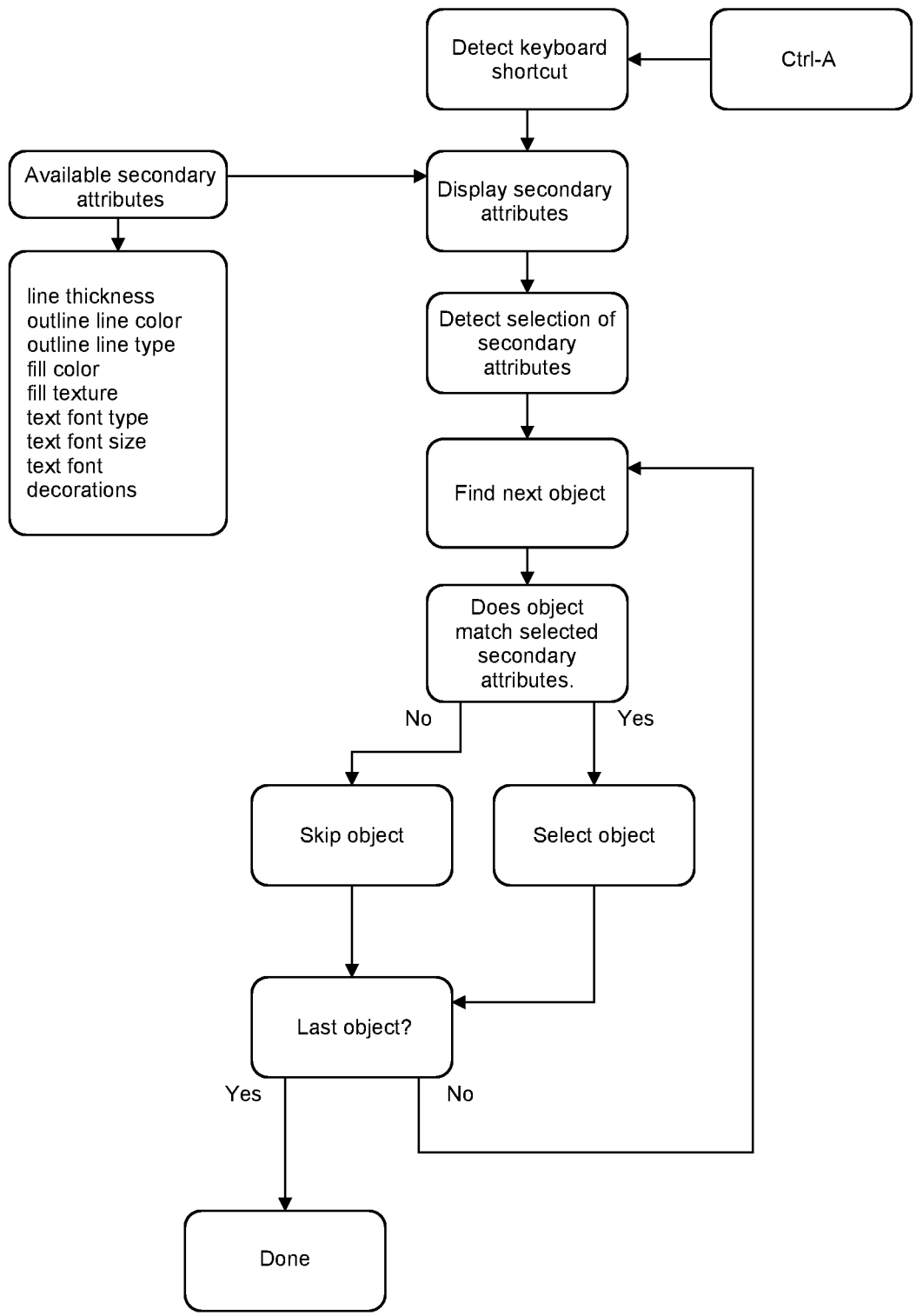
FIG. 6 is a logic flow diagram illustrating the process for implementation of the steps in the method of selecting objects according to this invention disclosed in claim 2.

Viewing now, simultaneously, FIG. 3 and FIG. 6, the user engages the keyboard selection shortcut again, which causes displaying a selection criteria window permitting the user to select the secondary attributes among outline line thickness, outline line color, outline line type, fill color, fill texture, text font type, text font size, text font decorations (in the selection criteria window shown in FIG. 3, the secondary attributes are shortened to "Color, Type, Thickness, Fill color, Fill texture, Font type, Font size and Font decorations").

The user is shown in the bottom portion of FIG. 3 to select the outline line thickness as the secondary attribute. This causes selection of all objects comprising both, the same type as the first selected object and the selected secondary attributes. Accordingly, only the lines in the upper portion of the computer screen are selected, because they have both, the type (i.e. a line) and the secondary attribute (i.e. the outline line thickness). The line in the lower right portion of the computer screen is not selected because, even thought it has the requisite type ("a line"), it lacks the secondary attribute, the outline line thickness.

Figure 8:
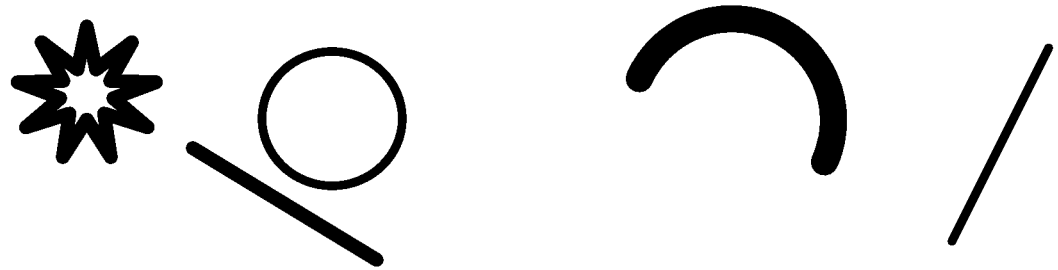
FIG. 8 shows examples of objects with different outline line thickness.
Figure 8:
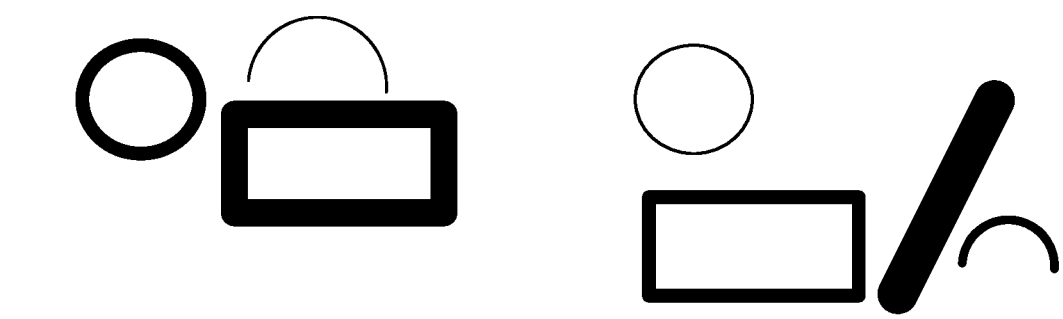
Figure 8:
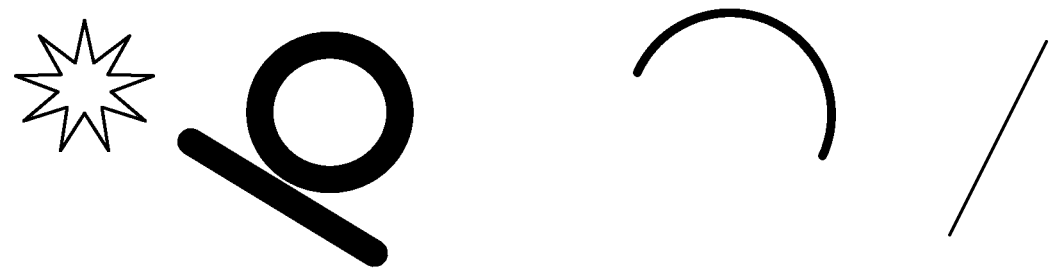
Figure 8:
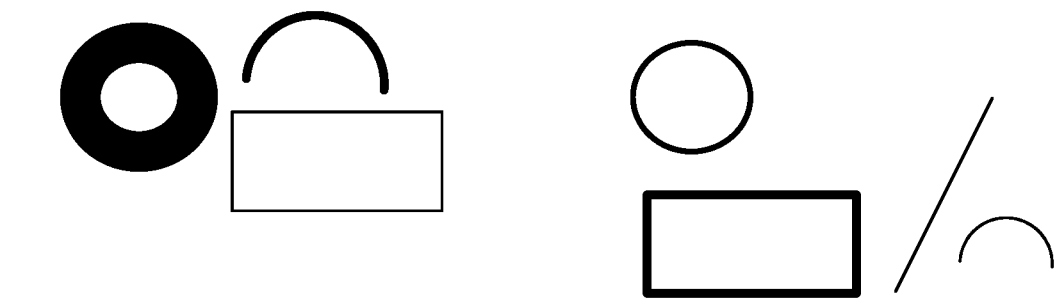

Viewing now FIG. 8, it shows examples of objects with different outline line thickness. When the secondary attributes described with reference to FIG. 3 include "thickness", only the objects with the same outline line thickness as the first selected object are selected.

Figure 9:
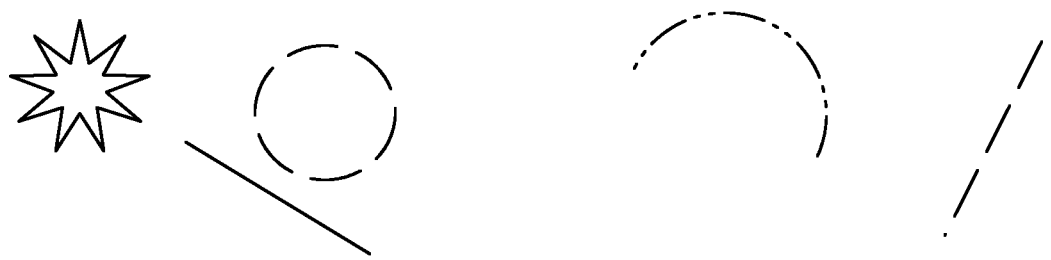
FIG. 9 shows objects with different outline line types.
Figure 9:
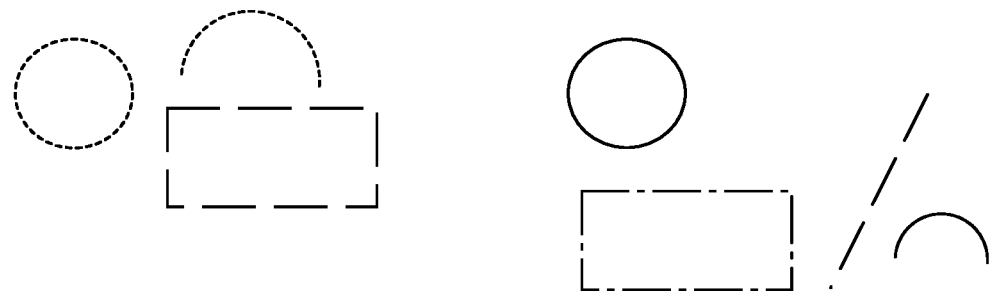
Figure 9:
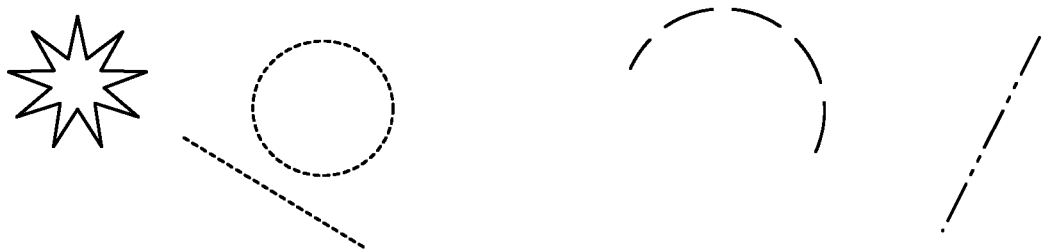
Figure 9:
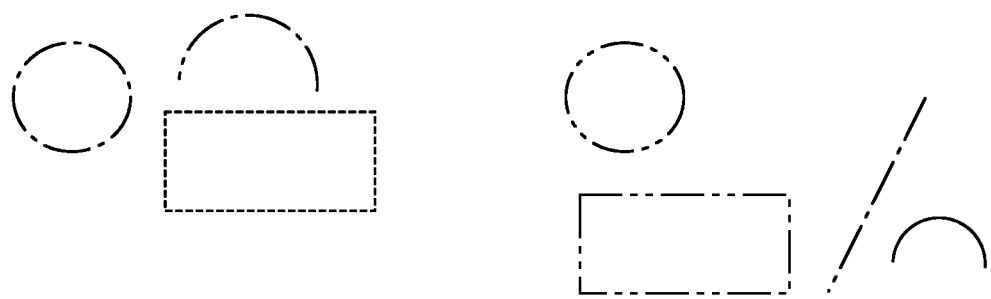

Viewing now FIG. 9, it shows examples of objects with different outline line types. When the secondary attributes described with reference to FIG. 3 include "type", only the objects with the same outline line type as the first selected object are selected. Selecting "color" as the secondary attribute works the same way.

Figure 10:
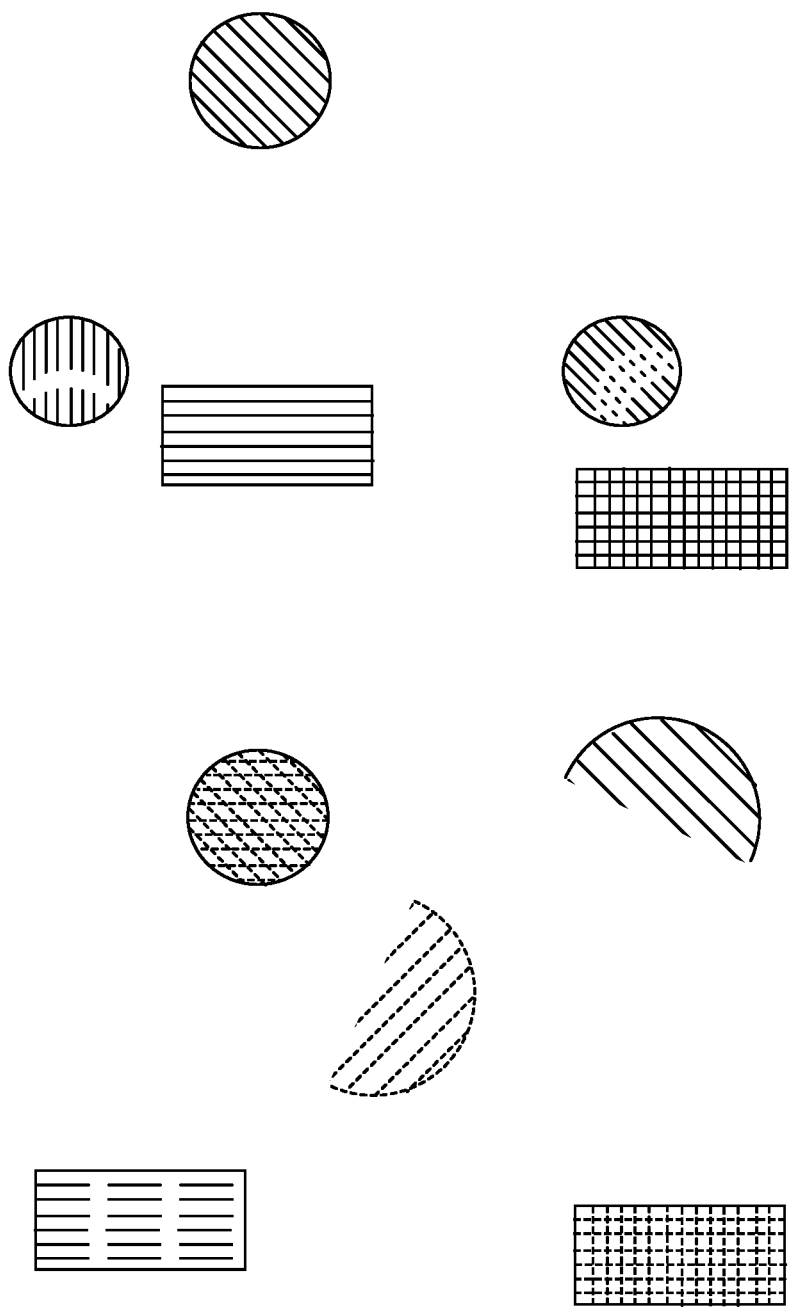
FIG. 10 shows examples of objects with different fill textures.

Viewing now FIG. 10, it shows examples of objects with different fill textures. When the secondary attributes described with reference to FIG. 3 include "fill texture", only the objects with the fill texture as the first selected object are selected. Selecting "fill color" as the secondary attribute works the same way.

Viewing now FIG. 11, it shows examples of text with different font types, sizes and decorations. When the secondary attributes described with reference to FIG. 3 include "font type", only the text with the font type as the first selected object (text in this example) are selected. Selecting "font size" and "font decorations" as the secondary attributes works the same way.

Figure 7:
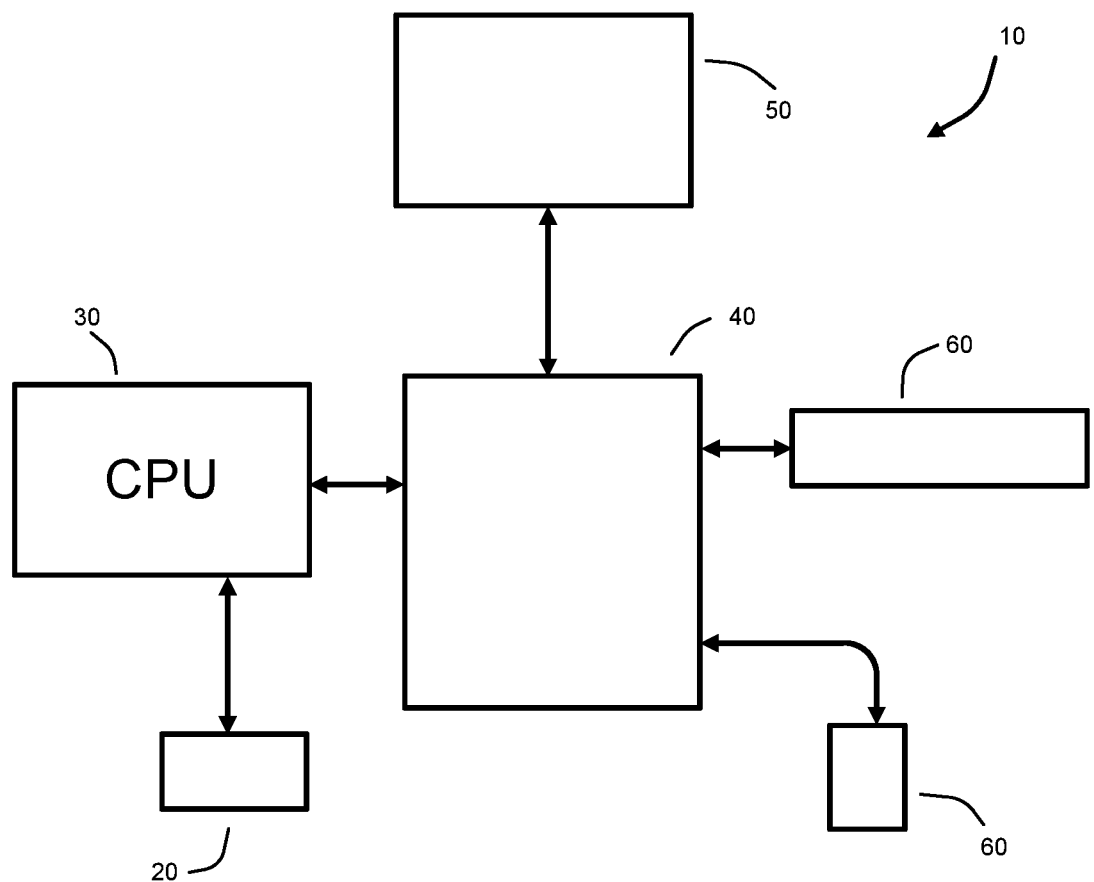
FIG. 7 is a block diagram depicting a system according to this invention disclosed in claims 5-8.

Viewing now FIG. 7, numeral 10 indicates a computer system for selecting objects displayed on the computer screen according to this invention. Numeral 20 indicates a memory. Memory 20 is encoded with the computer graphic software application performing the operations described above with reference to FIG. 2 through FIG. 6. Numeral 30 indicates a processor. Numeral 40 indicates a communications interface. Numeral 50 indicates a display. Numeral 60 indicates an input device. In FIG. 7, two input devices 60 are shown, a keyboard and a mouse. Numeral 70 indicates an interconnection means. Communication interface 40 couples memory 20, processor 30, display 50 and input devices 60.

The invention claimed is:

1. A method for selecting objects displayed on a computer screen implemented by a computer graphic software application comprising a keyboard selection shortcut, each said object comprising a type and one or more secondary attributes, comprising the steps of:
   under control of the user, selecting a first object;
   in response to the user's engaging the keyboard selection shortcut after selecting the first object, selecting all other objects comprising the same type as the first object;
   wherein, in response to the user's engaging the keyboard selection shortcut again, providing a list of secondary attributes by way of displaying a selection criteria window permitting the user to select the secondary attributes;
   wherein, in response to the user's selection of the secondary attributes, selecting all objects comprising both, the same type as the first selected object and said selected secondary attributes.

2. A method for selecting objects displayed on a computer screen as in claim 1, further comprising the step of, in response to the user's engaging the keyboard selection shortcut again after selecting all other objects comprising both, the same type as the first selected object and said selected secondary attributes, selecting all objects displayed on the screen.

3. A method for selecting objects displayed on a computer screen as in claim 2, wherein the type is selected from the group consisting of a line, a rectangle, a triangle, an arc, a circle, a text, an image, a table, a complex shape;
   wherein the secondary attributes are selected from the group consisting of outline line thickness, outline line color, outline line type, fill color, fill texture, text font type, text font size, text font decorations.

4. A computer system for selecting objects displayed on a computer screen comprising a memory, a processor, a communications interface, a display, one or more input devices, the communications interface coupling the memory, the processor, the display and the input devices;
   wherein the memory is encoded with a computer graphic software application comprising a keyboard selection shortcut, each said object comprising a type and one or more secondary attributes, the computer graphic software application, when executed by the processor, performs operations of:
   under control of the user, selecting a first object;
   in response to the user's engaging the keyboard selection shortcut after selecting the first object, selecting all other objects comprising the same type as the first object;
   wherein, in response to the user's engaging the keyboard selection shortcut again, providing a list of secondary attributes by way of displaying a selection criteria window permitting the user to select the secondary attributes;
   wherein, in response to the user's selection of the secondary attributes, selecting all other objects comprising both, the same type as the first selected object and said selected secondary attributes.

5. A computer system as in claim 4, wherein the computer graphic software application further performing the operations of:
   in response to the user's engaging the keyboard selection shortcut again after selecting all other objects comprising both, the same type as the first selected object and said selected secondary attributes, selecting all objects displayed on the screen.

6. A computer system as in claim 5, wherein the type is selected from the group consisting of a line, a rectangle, a triangle, an arc, a circle, a text, an image, a table, a complex shape;
    wherein the secondary attributes are selected from the group consisting of outline line thickness, outline line color, outline line type, fill color, fill texture, text font type, text font size, text font decorations.

\* \* \* \* \*